(12) United States Patent
McPherson et al.

(10) Patent No.: US 9,275,938 B1
(45) Date of Patent: Mar. 1, 2016

(54) LOW PROFILE HIGH TEMPERATURE DOUBLE SIDED FLIP CHIP POWER PACKAGING

(71) Applicant: Arkansas Power Electronics International, Inc., Fayetteville, AR (US)

(72) Inventors: Brice McPherson, Fayetteville, AR (US); Brandon Passmore, Fayetteville, AR (US); Adam Barkley, Springdale, AR (US); Robert Shaw, Springdale, AR (US)

(73) Assignee: Cree Fayetteville, Inc., Fayetteville, AK (US)

( * ) Notice: Subject to any disclaimer, the term of this patent is extended or adjusted under 35 U.S.C. 154(b) by 184 days.

(21) Appl. No.: 14/016,728

(22) Filed: Sep. 3, 2013

Related U.S. Application Data

(60) Provisional application No. 61/695,500, filed on Aug. 31, 2012.

(51) Int. Cl.
*H01L 23/48* (2006.01)
*H01L 23/495* (2006.01)

(52) U.S. Cl.
CPC ............. *H01L 23/495* (2013.01); *H01L 23/48* (2013.01)

(58) Field of Classification Search
CPC ............. H01L 2924/1305; H01L 2224/49175; H01L 23/3121; H01L 24/36
See application file for complete search history.

(56) References Cited

U.S. PATENT DOCUMENTS

| | | | |
|---|---|---|---|
| 6,060,795 A * | 5/2000 | Azotea et al. ............. | 307/150 |
| 6,307,755 B1 | 10/2001 | Williams et al. ........... | 361/813 |
| 7,098,051 B2 * | 8/2006 | Quah .......................... | 438/15 |
| 7,687,903 B2 | 3/2010 | Son et al. .................... | 257/723 |
| 7,786,486 B2 | 8/2010 | Casey et al. ................ | 257/76 |
| 8,018,056 B2 | 9/2011 | Hauenstein ................ | 257/730 |
| 8,120,153 B1 * | 2/2012 | Shen .......................... | 257/677 |
| 8,368,210 B2 | 2/2013 | Hauenstein ................ | 257/724 |
| 8,916,968 B2 * | 12/2014 | Mahler et al. .............. | 257/724 |
| 2003/0080402 A1 * | 5/2003 | Corisis ........................ | 257/678 |

* cited by examiner

*Primary Examiner* — Roy Potter
(74) *Attorney, Agent, or Firm* — Baker & Hostetler LLP

(57) ABSTRACT

A wire bondless, double flip chipped discrete power package including a base plate for structural support, heat spreading, and thermal connection, power substrate for electrical interconnection and isolation, lead frames for external connections, an upper substrate for topside electrical interconnection, and injection molded housing for mounting, isolation, and protection.

20 Claims, 11 Drawing Sheets

LOW PROFILE HIGH TEMPERATURE DOUBLE SIDED FLIP CHIP POWER PACKAGING

CROSS-REFERENCE TO RELATED APPLICATIONS

This application claims priority of U.S. Patent Application 61/695,500, filed Aug. 31, 2012 entitled LOW PROFILE BI-HECTO CELCIUS DOUBLE SIDED INTERCONNECT POWER DEVICE PACKAGING, which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in power devices. The present invention is specifically directed to packaging for high temperature applications.

2. Description of the Known Art

As will be appreciated by those skilled in the art, wide band gap materials, such as Silicon Carbide, SiC, and Gallium Nitride, GaN, are ideal for next generation power devices, offering superior performance in comparison to traditional Silicon, Si, based switches. In particular, substantially higher voltage breakdown strengths allow devices to be fabricated with blocking layers up to an order of magnitude thinner, directly reducing channel resistances and increasing switching speed. Wide band gap power devices are a maturing technology with a growing selection of power components, diodes, MOSFETs, JFETs, HEMTs, and BJTs, available on the commercial market from a diversity of vendors.

While the intrinsic features of these materials, combined with advanced device design and fabrication techniques, have created power switches with unprecedented levels of performance, their true potential is hindered by conventional power packages, materials, attaches, and layout techniques.

In order to unlock the revolutionary performances promised by wide band gap power devices, the power packaging, gate drive, busing, heat removal, and control systems must be specifically designed around high temperature wide band gap technology. With these tools, a system level designer may significantly increase the efficiency and reduce the weight and volume of the entire power conversion system including motor drives, inverters, battery chargers, etc. This includes a reduction of the power module itself, reduced size or complexity of the heat removal system such as a heat sink, cold plate, etc., decreased output filter size by utilizing high frequency switching, and placement in high ambient environments such as under the hood of a vehicle without the need for thermal isolation.

High Performance Discrete Packaging

At the module level, multiple devices are co-packaged in various topologies such as half-bridge, full-bridge and paralleled in order to reach the current level desired or until the available area in the module is occupied. While this is a powerful approach for very high current levels like those >100 A and for large, integrated systems, there are few options at the discrete level, only single switches and a diode, if necessary for currents in the 50-100 A range that also offer low inductance, high temperature capability, and flexibility of use. Standard discrete or small footprint wire bonded power packages include transistor outline 10, TO packages, such as the TO-254, and small outline transistor 20, SOT, Isotop packages, each displayed in FIG. 1. While these packages are effective for conventional silicon, Si, devices, limitations are clearly encountered with the high frequency, high current density performances characteristic of wide band gap devices.

TO style packages 10 are often current limited due to small cross sectional area of the pin contacts, have a thin base plate which is not effective for heat spreading, and only have one mounting point at the edge of the package, making it difficult to form an efficient thermal path between the package and the heat removal system. Isotop packages 20 are capable of higher currents due to their blade style connections and have improved mounting features; however, they can suffer from a high lead inductance and are generally constructed with materials not capable of reaching temperatures above 175° C.

As shown in FIG. 2, vertical power devices 30 predominately have upper pads metallized with aluminum and are intended for wire bonding. Current flows through the die area vertically, which is ideal for minimizing the on-resistances. A metallized backside connection is soldered to a thermally and electrically conductive substrate, forming an efficient path, utilizing the entire die footprint, for the heat generated in the device during conduction and switching to be transferred to a heat sink. FIG. 2 displays a variety of wire bonded wide bandgap power devices.

Wire bonds are a core element providing topside interconnection in the majority of power modules today. However, they are a substantial source of parasitic impedances and reliability issues especially at higher temperatures. Parasitic inductances contributed by the packaging and internal interconnection of a power electronic module are a major factor limiting switching speed and performance in a power conversion system. This is even more relevant for high performance wide band gap power switches, which feature rise and fall times in the 10 s of ns. Wire bond interconnects impose enormous challenges for electronic package designers, including:

Considerable parasitic impedances due to small wire cross-sections such as 0.005 in to 0.020 in, relatively long lengths, and the need for bond loops.
Current crowding on die pads.
Under-utilization of the entire bonding surface.
Possibility of fusing during a current spike.
Stability in high vibration environments.
Clearance issues for the wire bonding equipment.
Potential reliability issues during power cycling.
Metallurgical compatibility concerns.

FIG. 3 shows an example of a lateral power device 40. In low power systems, such as high frequency RF devices, and semiconductor technologies where only lateral devices may be formed, including GaN, there are multiple wire bondless options in production. Many high frequency devices utilize a flip-chip attach, in which an array of electrical connections are established to the device by forming pillars of either copper, solder alloys, or gold balls on the device. These pillars are then soldered or ultrasonically welded to the package or another device. This approach, however, is a critical issue for power, as the pillar arrays form a poor thermal connection with the rest of the system due to their restrictive geometry. The thermal connection is further impeded by the use of underfill that is a stress relieving and voltage blocking material applied between and around the bumps, which generally has a low thermal conductivity. The backside of the device is typically left as the bare substrate i.e., Si, SiC, sapphire, etc. and is attached with epoxy, which also has a comparatively poor thermal conductivity to a soldered attach.

Accordingly, for both lateral and vertical devices, hereafter inclusively referred to as generic die device 60 a dual sided solder connection is desirable, providing an ideal electrical and thermal connection to both sides. This style of attach takes advantage of the efficient heat removal nature of a vertical device with the wire bondless interconnection of a flip chip attach. These metallic connections would be low profile, low inductance, low resistance, and highly effective at transferring heat. A dual sided connection requires vertical devices to have solderable top side metallizations and lateral devices to have electrical vias through the die and a solderable backside metallization. Lateral devices without backside connections could be incorporated with a thermally conductive epoxy, which an associated tradeoff in current density.

Power modules or packages are known in various forms. Patents include U.S. Pat. No. 7,687,903, issued to Son, et al. on Mar. 30, 2010 entitled Power module and method of fabricating the same; U.S. Pat. No. 7,786,486 issued to Casey, et al. on Aug. 31, 2010 entitled Double-sided package for power module; U.S. Pat. No. 8,018,056 issued to Hauenstein on Sep. 13, 2011 entitled Package for high power density devices; U.S. Pat. No. 8,368,210 issued to Hauenstein on Feb. 5, 2013 entitled Wafer scale package for high power devices; U.S. Pat. No. 6,307,755 issued to Williams, et al. on Oct. 23, 2001 entitled Surface mount semiconductor package, die-leadframe combination and leadframe therefore and method of mounting leadframes to surfaces of semiconductor die. Each of these patents is hereby expressly incorporated by reference in their entirety.

SUMMARY OF THE INVENTION

The present invention teaches the construction of a power package. The purpose of this invention is to respond to the issues associated with wire bonds, parasitic impedances, heat removal, current density, physical mounting and ease of use. It includes the following highlights:

High current 50-100 A, high performance design.
High temperature up to 225° C. package components and attaches.
Wire bondless interconnection formed through a dual-sided flip chip connection.
Capable of housing both lateral and vertical devices.
Low profile, minimum distance, low inductance electrical paths.
Bolted electrical connections for system integration without soldering.
Multiple base plate mounting locations for an even, consistent thermal connection.
Double-sided cooling
High-voltage scalable
A source Kelvin connection This package is presented as a wire bondless, double flip chipped discrete power package. This discrete power package consists of a number of primary elements, including the base plate for structural support, heat spreading, and thermal connection, power substrate for electrical interconnection and isolation, lead frames for external connections, an upper substrate for topside electrical interconnection, and injection molded housing for mounting, isolation, and protection.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
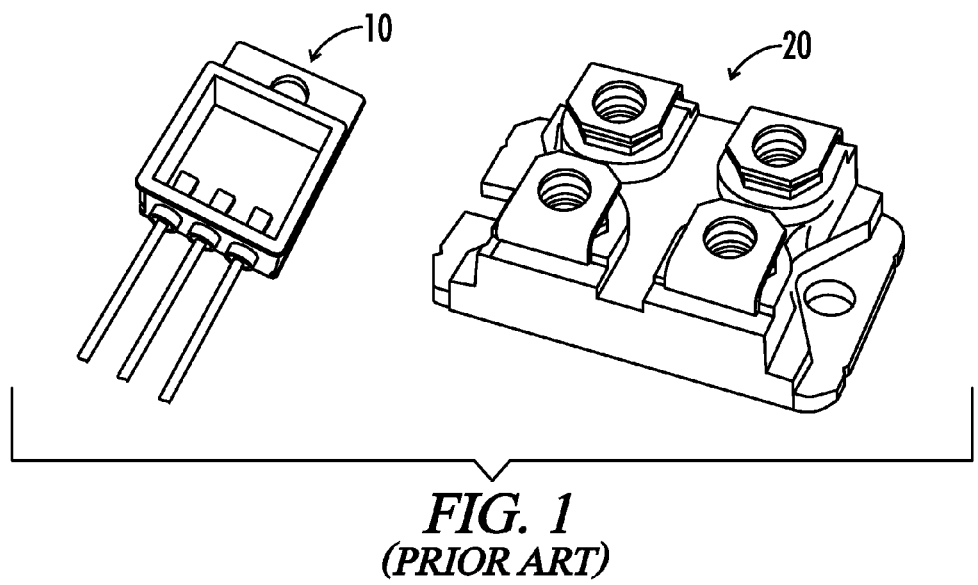
FIG. 1 shows a conventional discrete power packages including a TO-254 on the left and an isotop on the right.
Figure 2:
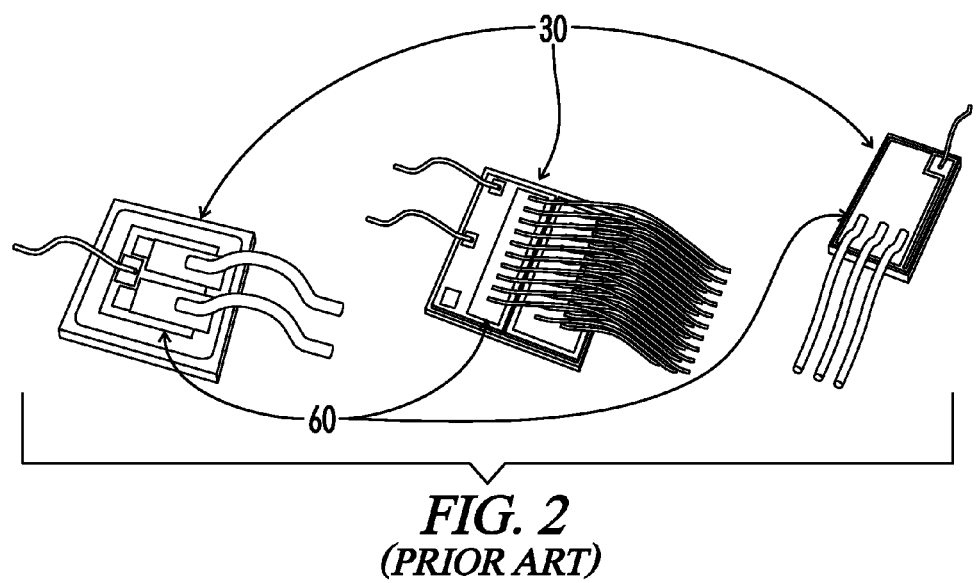
FIG. 2 shows examples of vertical power devices with wire bonds.
Figure 3:
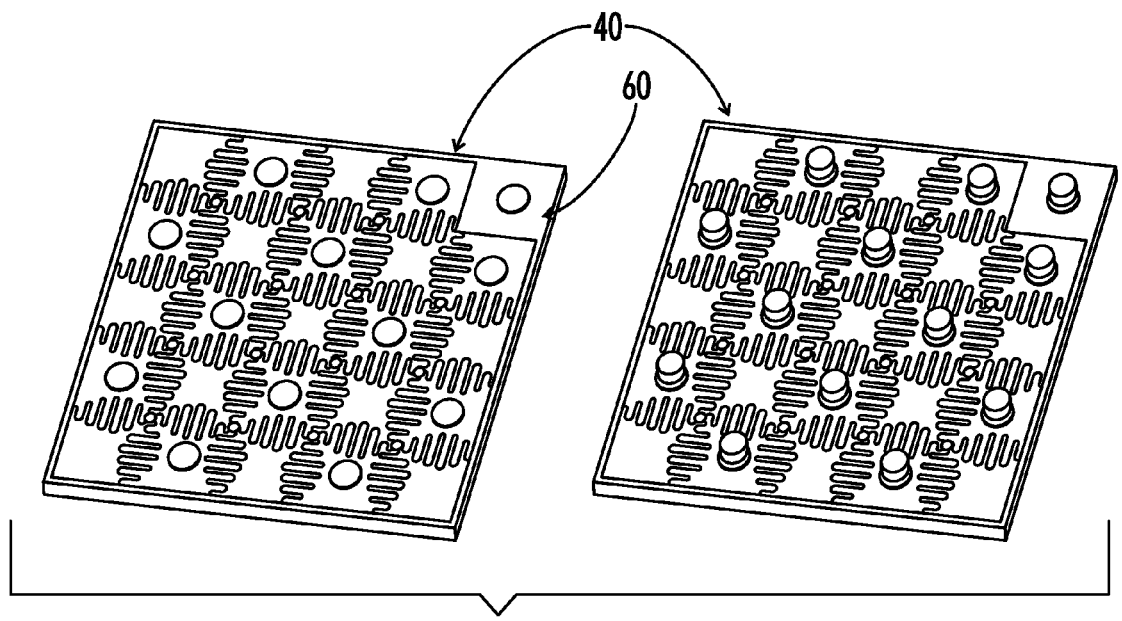
FIG. 3 shows an example of a lateral power device.
Figure 4:
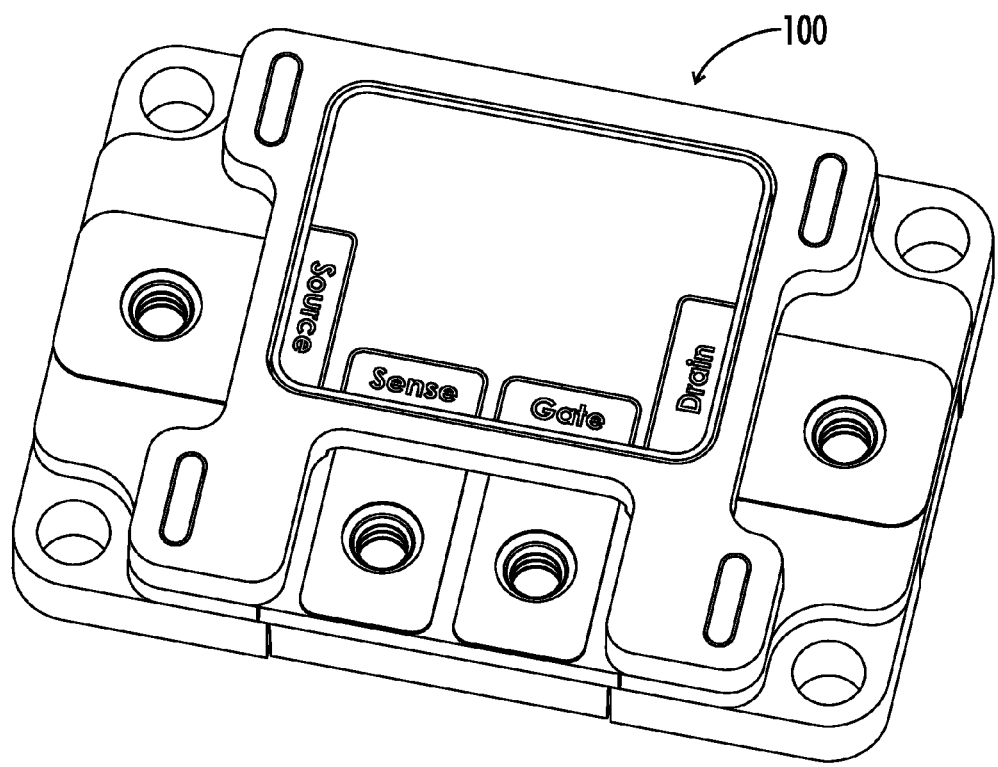
FIG. 4 shows a wire bondless, double flip chipped discrete power package.
Figure 5:
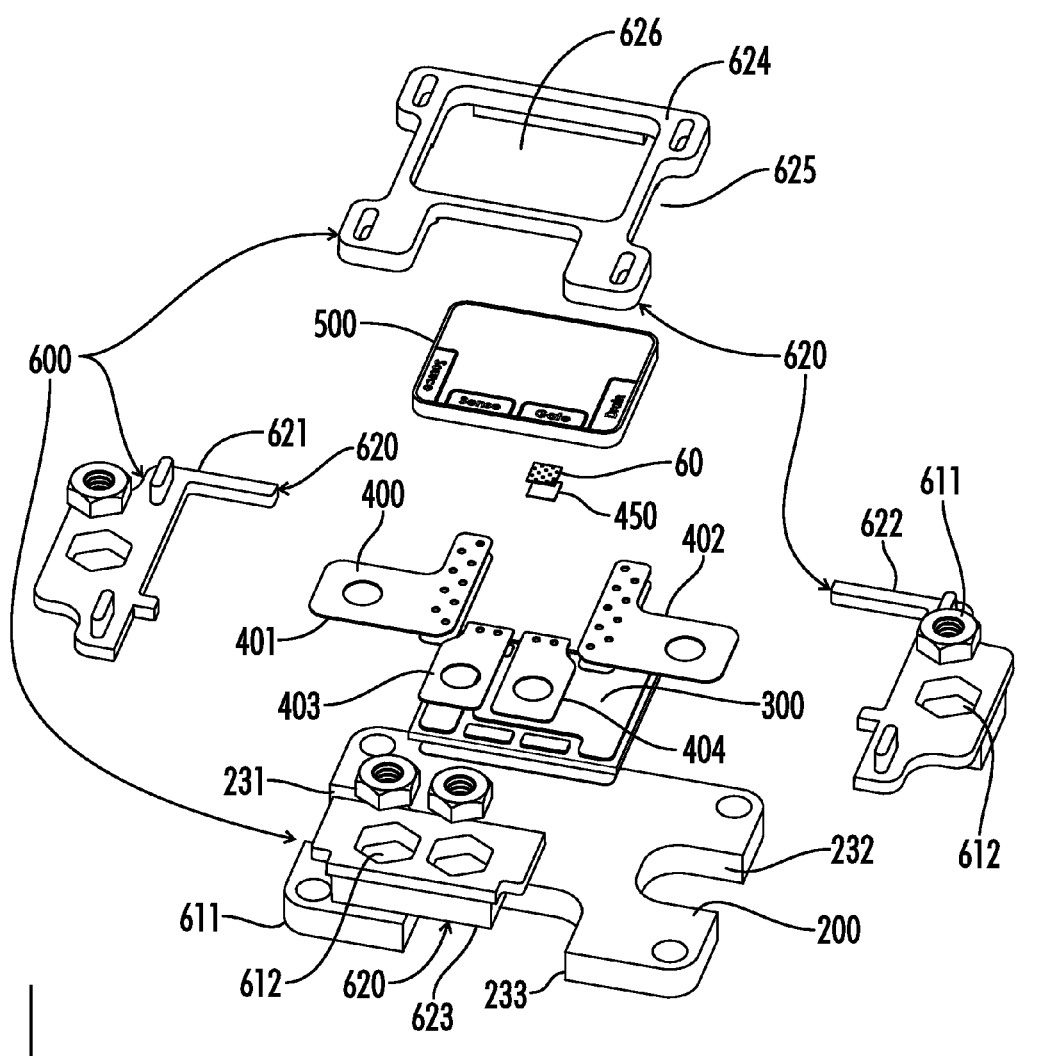
FIG. 5 shows an exploded view of the primary elements of the discrete package.

FIGS. 4 and 5 shows a wire bondless, double flip chipped discrete power package 100. The discrete power package 100 includes a base plate 200, lower power substrate 300, lead frames 400, an upper substrate 500, and a housing 600. These features are clearly understood in the exploded view provided in FIG. 5.

As noted in FIG. 5, the base plate 200 is formed with either a base metal i.e., copper, aluminum, etc. or an engineered composite metal i.e., copper tungsten, copper moly, aluminum graphite, etc. depending on application and service temperature. Base metals offer the highest thermal conductivity, but have a high coefficient of thermal expansion, CTE, which can cause stress issues at high temperature operation if not carefully accounted for. Engineered metals feature an effective compromise between thermal and mechanical performance, increasing reliability at the tradeoff of a somewhat reduced performance and increased cost. This package is designed to employ a variety of base plate 200 material options in order to best meet the needs of a given system and operational environment.

The base plate 200 includes a central body 210 with a base top 211, base bottom 212, left base side 213, right base side 214, base front 215, and base back 216. The central body 210 defines mounting apertures 220 and fastener apertures 230. The mounting apertures 220 are shown as a left back mounting aperture 221, right back mounting aperture 222, right front mounting aperture 223 and left front mounting aperture 224. The fastener apertures are shown as a single left fastener aperture 231, single right fastener aperture 232, and double front fastener aperture 233. In this manner, both single and plural size fastener apertures are shown.

The lower power substrate 300 is a bonded ceramic-metal structure including a direct bond copper, direct bond aluminum, active metal braze, etc. These substrates 300 are capable of carrying very high currents, and are formed with high thermal conductivity engineered ceramics such as aluminum nitride, AlN, and silicon nitride, Si3N4.

The upper interconnection substrate 500 can either be a second sheet consisting of a power substrate structure, or a printed circuit board, PCB, material, for electrical contact with the die device 60 depending on type, pad layout, and application.

The design of the lower power substrate 300 is envisioned to be identical for electrical connection to different die device 60 types using an attach 450, while the upper substrate 500 is patterned to match the specific layout of individual die devices 60.

Figure 6:
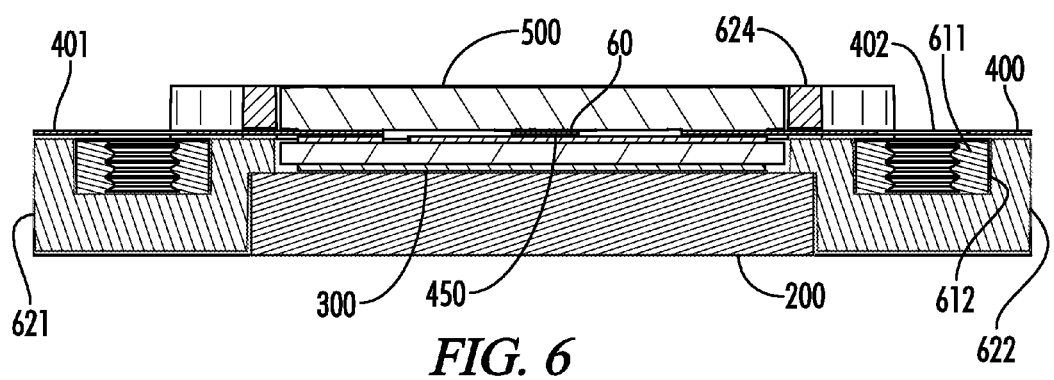
FIG. 6 shows a captive fastener approach.

FIGS. 5 and 6 shows the housing 600, similar in size to a TO-254 or about the size of two quarters laid side by side, that encases the power package 100. The housing 600 includes bolted electrical contacts 610 accomplished by captive fasteners 611 contained fastener restraining apertures 612 in the housing sections 620 shaped to loosely hold but restrain the fasteners 611 from turning or coming off of the power package 100. The housing sections include a left housing section 621, right housing section, 622, center housing section 623, and lid housing section 624. The captive fasteners 611 are trapped in the housing sections 620 by the conductive lead frames 400. The lid housing section 624 includes clearance apertures 625 and cooling aperture 626. The captive fastener technique is ideal for bolting to busbars, electrical contacts, or PCB boards, as the fastener is freely allowed to move vertically—pulling into the lead frame 400, and the connected surface, instead of pulling the lead frame 400 downwards in the case of a rigid fastener. In comparison to surface mount packages or housings with pins, electrical connections to this module can be formed without solder. This is a highly attractive feature, as initial connections are rapidly and easily formed, and rework is greatly simplified. FIG. 6 shows a cross section of the captive fastener approach.

Figure 7:
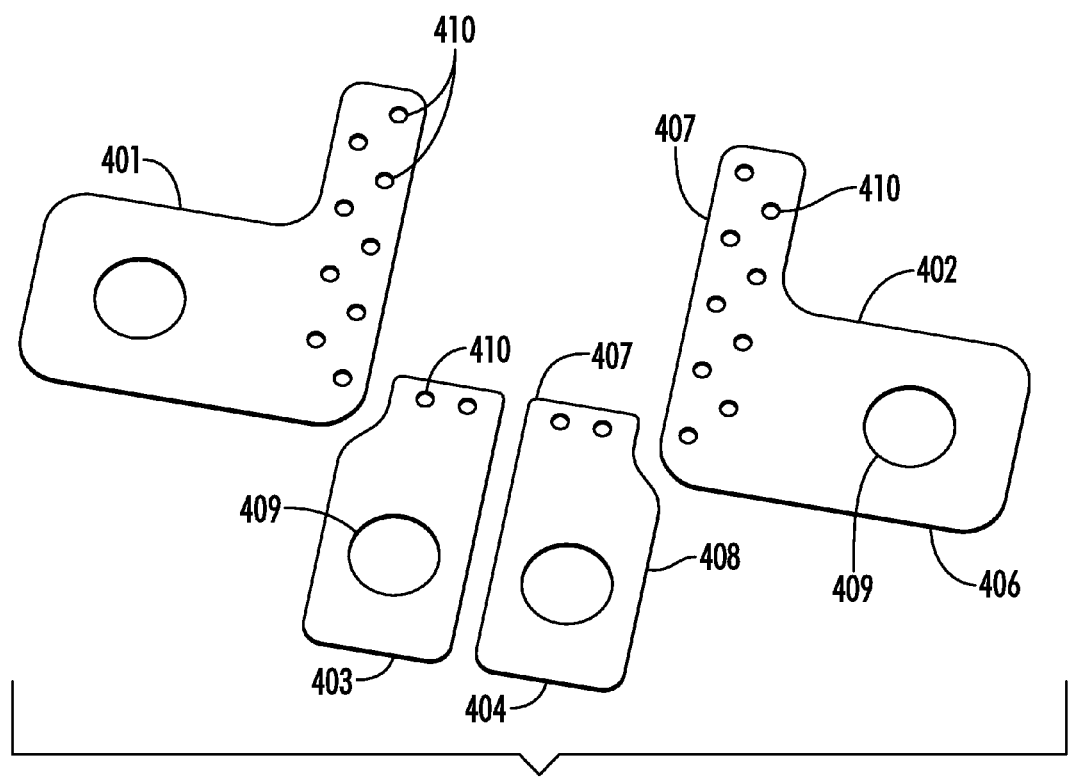
FIG. 7 shows power lead frames.

As seen by FIGS. 5, 6, and 7, the lead frames 400 provide the basic electrical connections. The lead frames 400 are made as a flat path wide trace for low inductance and include a large source lead frame 401, large drain lead frame 402, smaller sense lead frame 403, and smaller gate lead frame 404 for the embodiment shown. The large lead frames are shown as large foot extension 406 and varying internal leg 407 shaped lead frames while the smaller lead frames are shown as small foot extension 408 lead frames where the leg 407 attaches internally and the foot 406, 408 extends to the outside fastener apertures 409 located above the captive fasteners. The lead frames 400 provide a wide cross section to effectively reduce path inductances and resistances. They are formed by etching, with allows for complex shapes and features to be readily formed in the metal structure. Staggered solder catches 410 enhance the solder bond by pulling the molten metal up into the perforations through capillary, providing both vertical and lateral support once solidified. As noted by FIG. 6, they are thickness sized to be as thick as the die device 60 to act as a height buffer to add stability and stress relief to the die device 60.

Figure 8:
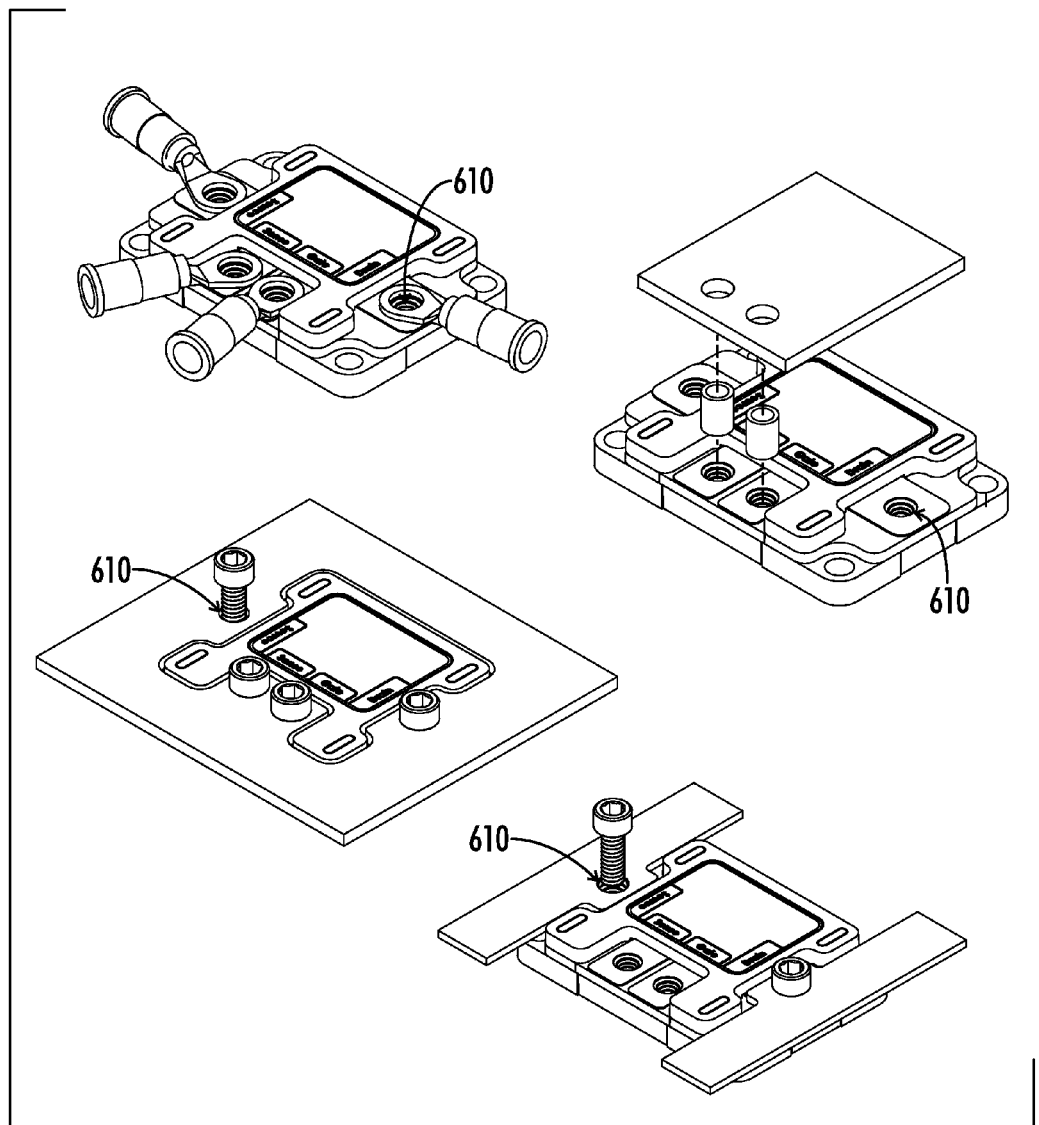
FIG. 8 shows various methods of electrical connections to the package.

FIG. 8 shows how various methods of electrical connections to the package can be made with a) wire terminals, b) conductive gate driver standoffs, c) direct PCB mounting using cutouts, and d) busbar connections. This is a direct benefit for systems integration, as it can be rapidly adapted to a variety of approaches without a substantial redesign phase, and allows for relatively straightforward reworking.

Figure 9:
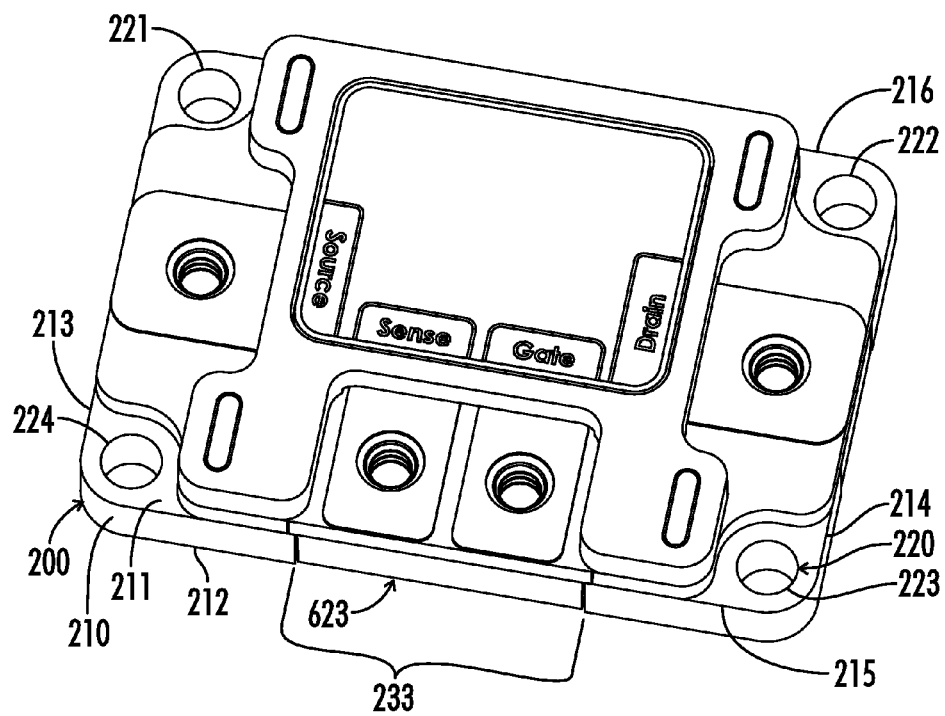
FIG. 9 shows an electrical connection arrangement.

Electrical connections are configured as shown in FIG. 9 with source terminal 910, sense terminal 912, gate terminal 914, and drain terminal 916. The source terminal 910 and drain terminal 912 are placed in-line, with gate terminal 914 and sense terminal 912 located on the edge for gate driver connection. The separate sense terminal is useful in forming a kelvin connection, unaffected by the drain current, which provides more accurate measurement feedback to the gate driver.

Figure 10:
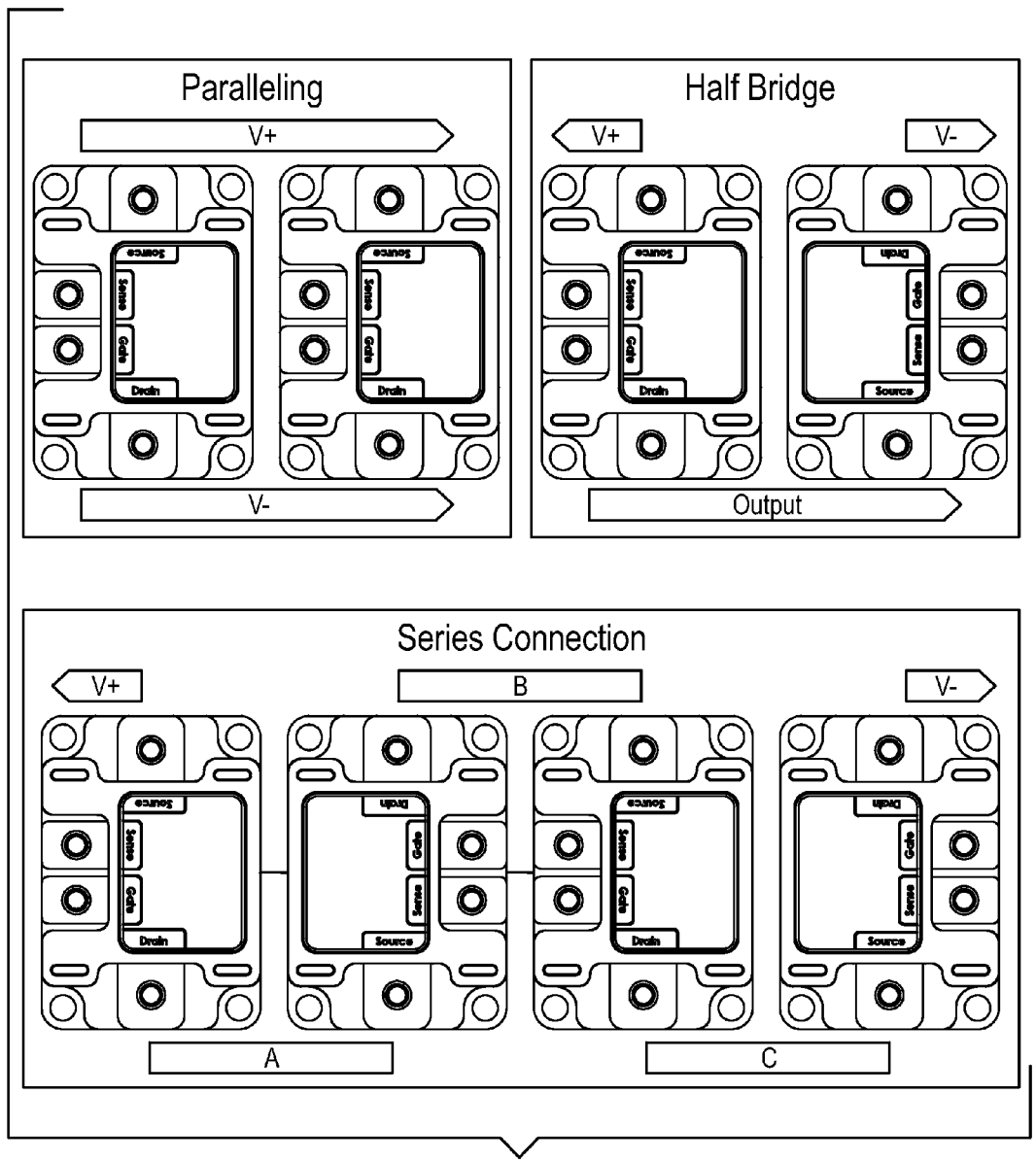
FIG. 10 shows a topology arrangements of the discrete package.

FIG. 10 shows how a prominent attribute of this package is the layout of the external connections for topology arrangements of the discrete package. The bolted contacts are arranged such that a variety of topologies can be formed with each discrete package. They can be readily A) paralleled, B) formed into half and full-bridge configurations, or C) connected in series for increased voltage or for multi-level converters. Each topology uses discrete power packages with each power package including a source terminal side 1001, a sense terminal side 1002 opposite the source terminal side 1001, a gate and drain terminal side 1003, and a back side 1004.

The parallel topology 1010 has the first power package 1011 back side 1004 positioned adjacent to the second power package 1012 gate and drain terminal side 1003.

The half bridge topology 1020 has the first power package 1011 back side 1004 positioned adjacent to the second power package 1012 back side 1004.

The series connection topology 1030 has the first power package 1011 back side 1004 positioned adjacent to the second power package 1012 back side 1004, the second power package 1012 front side 1003 positioned adjacent to the third power package 1013 front side 1003, and the third power package 1013 back side 1004 positioned adjacent to the fourth power package 1014 back side 1004.

Thermal-Mechanical Design

Many important, interrelated variables exist in the various functional elements of a power package 100. These factors can be arranged into two groups: materials and geometry. Materials are outlined for the various components, including: base plate 200, power substrate 300 metal, power substrate 300, 500 ceramic, external connection, lead frames 400, pins, etc., housing 600, encapsulation/passivation, surface finish, plating, etc., and solder attaches 350, 450. Properties such as thermal conductivity, density, stiffness, and CTE were carefully outlined for each candidate material. Geometrical variables include base plate 200 footprint, base plate 200 thickness, power substrate 300 metal thickness, power substrate 300 ceramic thickness, solder attach 350, 450 thickness, die device 60 spacing, lead frame clearances, clearances for assembly hardware, vertical clearances, fastener 611 locations, and lead frame 400 geometry. The discrete package was designed such that CTE mismatches were minimized using advanced packaging materials. This reduces thermal mechanical stress and increases reliability.

Processing

Figure 11:
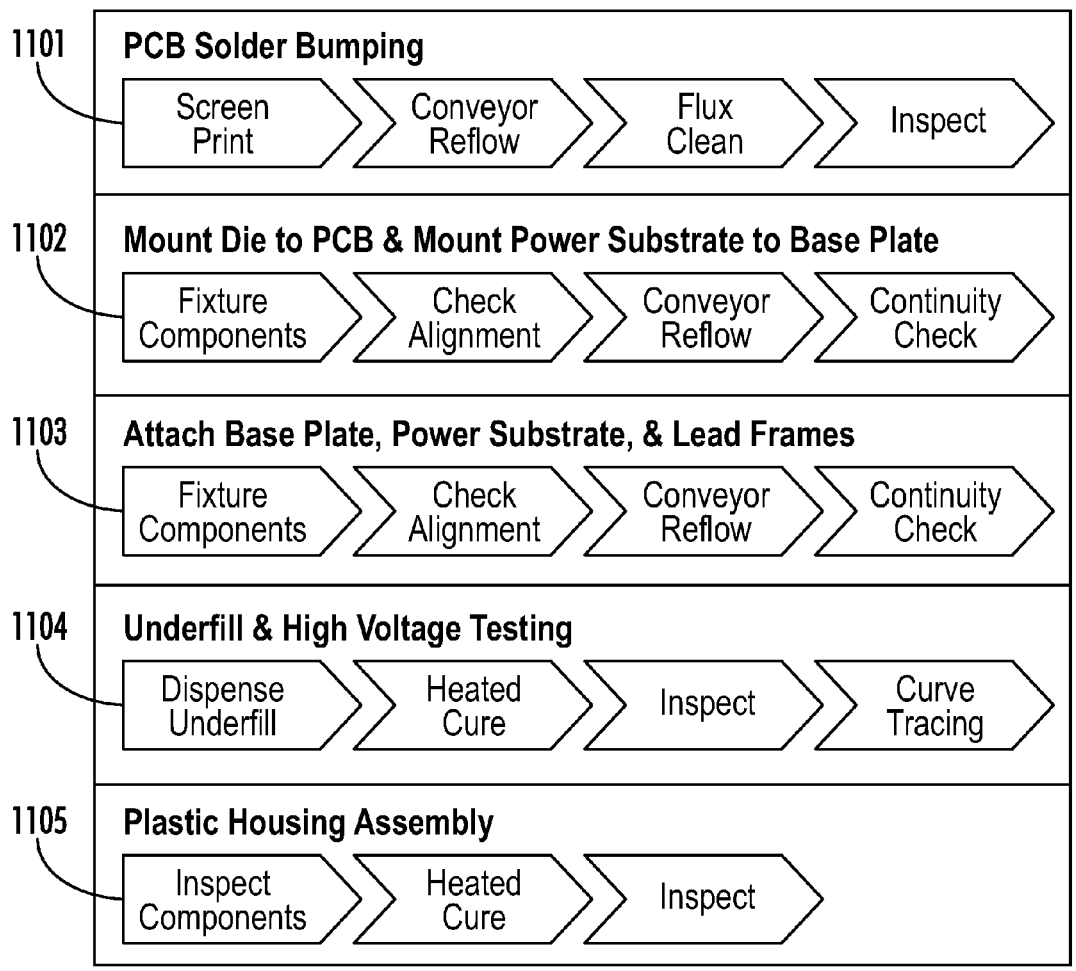
FIG. 11 shows an assembly process flow.

The entire build process flow is outlined in FIG. 11. The build process of this package was designed to involve processes well suited for volume production. As such, each build can be implemented as a continuous process in-line on automatic or semi-automatic systems.

The PCB solder bumping 1101 initiates the process. Typical die devices 60 intended for flip chip packages have the solder applied at the wafer level, often at the top of an electroplated copper pillar. While this package is capable of housing 600 these pre-tinned devices, many die, in particular vertical devices, are not available with a previously applied solder layer or patterned for solder bumping. In this process, the solder is applied to the interconnection PCB or upper substrate 500, not the die device 60, through screen printing. This provides a high level of flexibility and allows for a larger variety of die devices 60, solders, and metallization layers to be employed.

A laser cut stainless steel stencil and a semiautomatic screen printer are used to selectively pattern a solder paste to the interconnection board version of the upper substrate 500. After solder deposition, the flux is cleaned from the boards. These boards are then inspected for defects, which can be thrown out or reworked without sacrificing the device, often the most expensive element in the package. Following flux cleaning, die devices 60 are mounted 1102 to the interconnection boards in a flux free conveyor reflow process with a protective nitrogen blanket. While many flip chip processes are self-aligning due to the solder being applied to the die device 60, this process requires a machined graphite fixture to ensure optimal alignment and planarity of the die device 60. Once the die devices 60 are mounted to the carriers, they may be optically and/or electrically inspected to ensure that high quality connections are formed to the device terminals and that no unexpected shorting has occurred.

The lower assembly, consisting of the base plate 200, power substrate 300, and lead frames 400, is soldered 1103 in one step with the aid of graphite fixtures for alignment and pressure. This step may be assembled flux free on a conveyor reflow oven or in a vacuum oven, depending on quality and acceptable void fraction of an application. Preforms of the solder alloy are employed to control the location and volume of the solder desired.

Once the lower assembly has been assembled, and the die device 60 has been attached to the interconnection PCB, they may be attached together. This is either performed with solder or with a high temperature conductive epoxy, depending on application. The solder alloy may have a lower reflow temperature than the rest of the assembly, or may be the same alloy, given adequate fixtures are in place to ensure parts do not displace as they reach reflow. Following this step, visual and/or electrical inspections are performed to verify quality of the bonds and to check proper electrical interconnection.

High temperature underfill is applied 1104 through openings in the PCB, one for access and one as a vent, and cured on a hot plate. The underfill provides mechanical support as well as high voltage isolation. The final step is to insert 1105 the plastic pieces and fasteners, seal with epoxy.

REFERENCE NUMBERS USED THROUGHOUT THE DESCRIPTION ARE AS FOLLOWS

TO style packages 10
Isotop packages 20
vertical power devices 30
lateral power device 40
die device 60
die attach 450
wire bondless double flip chipped discrete power package 100
base plate 200
central body 210
base top 211
base bottom 212
left base side 213
right base side 214
base front 215
base back 216
mounting apertures 220
left back mounting aperture 221
right back mounting aperture 222
right front mounting aperture 223
left front mounting aperture 224
fastener apertures 230
single left fastener aperture 231
single right fastener aperture 232
double front fastener aperture 233
lower power substrate 300
lower substrate top 302
lower substrate bottom 304
lower substrate left side 305
lower substrate right side 306
lower substrate front 307
lower substrate back 308
lower attach 350
lead frames 400
large source lead frame 401
large drain lead frame 402
smaller sense lead frame 403
smaller gate lead frame 404
large foot extension 406
internal leg 407
small foot extension 408
outside fastener apertures 409
staggered solder catches 410
die attach 450
upper substrate 500
housing 600
bolted electrical contacts 610
captive fasteners 611
fastener restraining apertures 612
housing sections 620
left housing section 621
right housing section 622
center housing section 623
lid housing section 624
clearance apertures 625
cooling aperture 626
source terminal 910
sense terminal 912
gate terminal 914
drain terminal 916

What is claimed is:

1. A discrete power package, comprising:
   a base plate defining multiple mounting apertures;
   a lower power substrate mounted to the base plate;
   a device directly electrically connected, without wire bonds or solder balls, to the lower power substrate;
   at least one lead frame connected to the device;
   an upper substrate electrically connected to the device; and
   a housing surrounding the device.

2. The discrete power package of claim 1, wherein the upper substrate is directly electrically connected, without wire bonds or solder balls, to the device.

3. The discrete power package of claim 1, further comprising:
   bolted electrical connections to the at least one lead frame.

4. A discrete power package, comprising:
   a base plate defining a first base side, a second base side, and a base front;
   a lower power substrate mounted to the base plate;
   a device directly electrically connected, without wire bonds or solder balls, to the lower power substrate;

a source lead frame on the first base side, a drain lead frame on the second base side, and both a sense lead frame and a gate lead frame on the base front;
an upper substrate electrically connected to connected to the device; and
a housing surrounding the device.

5. A parallel topology using discrete power packages, comprising:
a first power package and a second power package,
each power package including a source terminal on a first side, a sense terminal on a second side opposite the first side, and both a gate terminal and a drain terminal on a front side connecting the first side and the second side, and a back side also connecting the first and second side, and
the first power package back side positioned adjacent to the second power package front side.

6. A half bridge topology using discrete power packages, comprising:
a first power package and a second power package,
each power package including a source terminal on a first side, a sense terminal on a second side opposite the first side, and both a gate terminal and a drain terminal on a front side connecting the first side and the second side, and a back side also connecting the first and second side, and
the first power package back side positioned adjacent to the second power package back side.

7. A series connection topology using discrete power packages, comprising:
a first power package, a second power package, a third power package, and a fourth power package,
each power package including a source terminal on a first side, a sense terminal on a second side opposite the first side, and both a gate terminal and a drain terminal on a front side connecting the first side and the second side, and a back side also connecting the first and second side, and
the first power package back side positioned adjacent to the second power package back side, the second power package front side positioned adjacent to the third power package front side, and the third power package back side positioned adjacent to the fourth power package back side.

8. The discrete power package of claim 4, wherein the base plate is a base metal.

9. The discrete power package of claim 4, wherein the lower power substrate is a bonded ceramic-metal structure.

10. The discrete power package of claim 4, further comprising a captive fastener for each of the source lead frame, the drain lead frame, the sense lead frame, and the gate lead frame, wherein each captive fastener secures an electrical contact and is configured to move axially toward each lead frame.

11. The discrete power package of claim 4, wherein the upper substrate is directly electrically connected, without wire bonds or solder balls, to the device.

12. The parallel topology using discrete power packages of claim 5, wherein the base plate is a base metal.

13. The parallel topology using discrete power packages of claim 5, wherein the lower power substrate is a bonded ceramic-metal structure.

14. The parallel topology using discrete power packages of claim 5, further comprising a captive fastener for each of the source lead frame, the drain lead frame, the sense lead frame, and the gate lead frame, wherein each captive fastener secures an electrical contact and is configured to move axially toward each lead frame.

15. The half bridge topology using discrete power packages of claim 6, wherein the base plate is a base metal.

16. The half bridge topology using discrete power packages of claim 6, wherein the lower power substrate is a bonded ceramic-metal structure.

17. The half bridge topology using discrete power packages of claim 6, further comprising a captive fastener for each of the source lead frame, the drain lead frame, the sense lead frame, and the gate lead frame, wherein each captive fastener secures an electrical contact and is configured to move axially toward each lead frame.

18. The series connection topology using discrete power packages of claim 7, wherein the base plate is a base metal.

19. The series connection topology using discrete power packages of claim 7, wherein the lower power substrate is a bonded ceramic-metal structure.

20. The series connection topology using discrete power packages of claim 7, further comprising a captive fastener for each of the source lead frame, the drain lead frame, the sense lead frame, and the gate lead frame, wherein each captive fastener secures an electrical contact and is configured to move axially toward each lead frame.

* * * * *